United States Patent [19]

Arkosy

[11] 4,104,581
[45] Aug. 1, 1978

[54] METHOD UTILIZING AN AUTOMATIC RESETTABLE CIRCUIT BREAKER FOR LOCATING GROUND FAULTS IN A VEHICLE

[76] Inventor: Steven Arkosy, 463 Elevado Terrace, Monterey Park, Calif. 91754

[21] Appl. No.: 737,603

[22] Filed: Nov. 1, 1976

[51] Int. Cl.² ............................................. G01R 31/08
[52] U.S. Cl. ........................................................ 324/52
[58] Field of Search ..................... 324/51, 52, 67, 133

[56] References Cited

U.S. PATENT DOCUMENTS

| | | | |
|---|---|---|---|
| 2,103,179 | 12/1937 | Rennau | 324/52 |
| 2,641,633 | 6/1953 | Hosford | 324/52 |
| 2,716,216 | 8/1955 | Schwenzfeier | 324/52 X |
| 3,076,931 | 2/1963 | Jasper | 324/67 X |
| 3,621,384 | 11/1971 | Yamada | 324/52 |
| 3,623,142 | 11/1971 | Key | 324/52 |
| 3,699,433 | 10/1972 | Smith | 324/52 |
| 3,753,089 | 8/1973 | Gunn et al. | 324/133 X |

*Primary Examiner*—Gerard R. Strecker
*Attorney, Agent, or Firm*—Singer & Singer

[57] ABSTRACT

A method and apparatus for locating a grounded fault in an electrical circuit. An automatic resettable circuit breaker having two terminals is connected across a source of power and the circuit under test. The grounded fault condition causes the resettable circuit breaker to continually recycle in the presence of the grounded fault. An induction current measuring ammeter is movably positioned over the circuit under test to measure the varying current caused by the resettable circuit breaker. The actual location of the ground is determined by the immediate absence of a measured varying current.

1 Claim, 5 Drawing Figures

METHOD UTILIZING AN AUTOMATIC RESETTABLE CIRCUIT BREAKER FOR LOCATING GROUND FAULTS IN A VEHICLE

This invention is concerned primarily with a method and apparatus for physically locating a short and more particularly for physically locating a grounded fault in an electrical system.

This invention is primarily adapted for use in locating shorts in vehicles such as automobiles, trucks, boats, airplanes, or any other vehicle having a battery operated ignition system.

In the majority of vehicles of the type described, a battery ignition system is used in which the hot line which could be either the positive or negative side of the terminal is connected to an ignition switch through an ammeter and ultimately to a fuse box. The fuse box in turn contains separate circuits independently fused and connected to a variety of operating mechanisms such as radio, horn, lights, and any other electrical equipment located on the vehicle. The return line is usually connected to ground which completes the circuit to the opposite side of the battery which is also grounded. In certain vehicles the positive terminal of the battery is grounded and in other vehicles the negative side of the battery is grounded; however, in the practice of this invention there is no difference in operation since the apparatus and procedures for locating the shorted fault are the same.

The invention is intended to be used by both skilled and unskilled persons and as a result certain additional indicia are included to help and enable the unskilled person to recognize the fault condition by using perceptual indicia that excites both the visual and the aural senses. In the final analysis, however, these indicia are not needed to practice the invention, however, they are included for completeness only since the intended use of the invention is for all people regardless of their skill and their training.

The owner or user of a vehicle is usually first made aware of a grounded fault in the electrical system by his observation that certain equipment ceases to function and further that a fuse protecting that particular line has blown. In the usual case the operator or owner replaces the fuse only to discover that the additional fuse also blows out indicating to him that there is a fault on the line that has caused the short resulting in the protective fuse being burned out.

The fault locator comprises an automatic resettable circuit breaker that preferably utilizes a thermal element that opens the circuit breaker in the presence of the short circuit current and when cooled allows the circuit breaker to again close. In the preferred embodiment a buzzer and a lamp are connected in parallel across the circuit breaker terminals. The purpose of the buzzer and the lamp is to give an aural and a visual indication which may or may not be needed by the skilled user but is certainly advisable for the unskilled operator.

The fault locator may be used while other circuits of the vehicle are in operation, however, for purposes of explanation it is considered preferable for the operator to remove the hot terminal from the battery leaving the grounded terminal connected. As previously mentioned, the grounded terminal may either be the positive side of the battery or the negative side.

One terminal of the resettable circuit breaker is connected to the hot terminal of the battery and the other terminal of the circuit breaker connected to the load side of the circuit that has resulted in the blown fuse. The proper location will be immediately apparent because of a spark that will immediately exist when the circuit breaker lead is attached to the defective load side containing the fault. The spark is to be expected since a short circuit current will immediately flow from the battery through the circuit breaker and to the defective load containing the ground fault. The short circuit current will immediately cause the resettable circuit breaker to open thereby protecting the battery from damage and also protecting the circuit under test. In the preferred embodiment the lamp and the buzzer connected in parallel across the circuit breaker will both be energized whenever the circuit breaker is open, thereby giving the operator both a visual indication and an aural indication that he has in fact located the line with the fault and that the system is operating properly. The light and buzzer will also indicate to the user that the fault is still on the line and has not been cured.

Should the operator by some mistake place the second line from the resettable circuit breaker on a load circuit that is not defective, there will of course be no flash since there is no short circuit current and the resettable circuit breaker will stay closed and not reset. In this condition the light and the buzzer will not give any indication and the user will immediately know that he has not located or selected the load having the short condition.

The operator by means of the flashing light and the buzzing sound knows that the resettable circuit breaker is operating and is connected to the load circuit having the grounded fault. An induction current measuring ammeter is movably positioned over the load circuit. The ammeter will read a varying short circuit current that will be obvious to the user since the ammeter needle will move violently from zero to a maximum neeand back to zero as the resettable circuit breaker alternately opens and closes.

The operator will move the ammeter along the circuit continually noting that the ammeter is moving from zero to a maximum which will indicate to him that he is on the line containing the short. If the operator should move to a line that is not defective there will of course be no varying short circuit current and the ammeter will continue to read zero.

The operator by noting the varying current indication from zero to the maximum back to zero will stay on the defective line until a point is reached when the current indication becomes zero on the defective line. The moment the ammeter ceases to vary and reads zero is the exact location of the ground.

The actual ground condition in a given line can be verified since the short circuit current flowing through the wire on one side of the ground will indicate zero to a maximum whereas the current on the other side of the grounded fault will always indicate zero with the exact point of zero indication being the exact location of the grounded fault.

The invention may be used while the vehicle is disconnected or the invention may be used while the vehicle is operating and in a hot condition. The disclosed fault locator is not limited to vehicles but may be used in household apartment houses, building establishments, and of course may be used in DC or AC applications.

The prior art discloses many different techniques and apparatus for detecting and locating grounded fault conditions.

The most simple detection scheme has always included a pair of light bulbs connected in series and located across the buzz line connecting the power. The central connection between the two bulbs is grounded. The lighting of either lamp will indicate a short in the line connected to that lamp. Many variations of this technique have been used as is disclosed in the Bowden U.S. Pat. No. 3,074,013. Unfortunately most of the prior art techniques do not locate the fault but rather only indicate to the observer that a fault condition exists.

A more elaborate technique for identifying a shorted condition is disclosed in U.S. Pat. No. 3,699,433 issued to Smith on Oct. 7, 1972. Smith discloses a plurality of circuit breakers connected in parallel and selected by the operator by means of a rotating switch. The idea is to select a circuit breaker approximating the size of the fuse in the circuit having the fault. Placing the circuit breaker in series with the load having the fault causes a short circuit current to energize a relay which in turn is operated to cause a light to shine and a tone generator to emit an audible sound.

The concept disclosed by Smith simply proves to the operator that a short exists and that using an ammeter to measure the short circuit current, Smith claims that a heavy current indicates a big short and a small short circuit current signifies a small short. It is interesting to note that Smith discloses no technique, method or apparatus to physically locate the short. He does indicate, however, in column 3, lines 35 through 44, that physically moving the wires should eventually result in the short being discovered which will be indicated by the lack of the flashing light and any sound from the tone generator.

The prior art as evidenced by Smith, Bowden and others is replete with techniques for verifying the fact that a short circuit condition exists but unfortunately the prior art does not disclose a technique, method or apparatus for pinpointing and physically locating the exact place of the fault as is specifically taught and described in the present invention.

Further objects and advantages of the present invention will be made more apparent as the description progresses, reference now being made to the accompanying drawings wherein.

Figure 1:
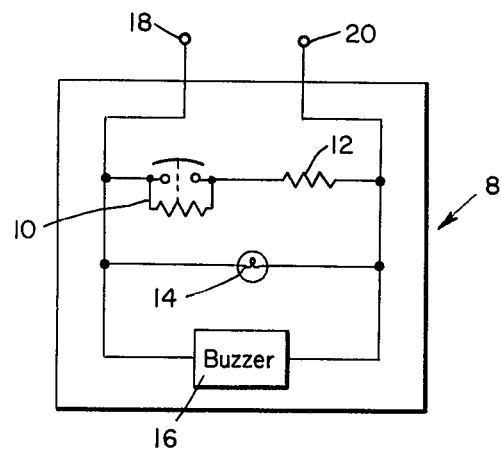
FIG. 1 is a schematic diagram illustrating details of construction of the fault locator.

FIG. 1 is a schematic drawing of a short detector comprising a resettable circuit breaker 10 connected in series with a load limiting resistor 12. A lamp 14 and a buzzer 16 are both connected in parallel across the series combination comprising the resettable circuit breaker 10 and the load limiting resistor 12.

The resettable circuit breaker 10 is a commercially available item and comprises circuit breaker points and a thermal element connected across the circuit breaker points that is responsive to the short circuit current that causes the circuit breaker to trip and be reset after the thermal element has cooled. The value of limiting resistor 12 is a function of whether the short locator 8 is to be used for AC or DC applications. Normally for AC applications the resistance of resistor 12 is higher in order to ensure steady state current flowing through the circuit breaker element without chattering which may be caused by the varying AC signal.

Terminals 18 and 20 in the preferred embodiment consist of relatively long leads of the order of six feet long and each having alligator clips to facilitate the connection and use of the short locator 8 in determining the location of the grounded faults in the electrical circuits. The lamp 14 and the buzzer 16 must of course be selected for the kind of circuit being used. For example, if the short locator is being used in a six volt DC electrical system, then of course the lamp 14 must be a six volt lamp and buzzer 16 must have the proper impedence to operate on a six volt system. Conversely, if the short locator is being used in a 110 volt AC circuit, then of course lamp 14 must be 110 volt rated and buzzer 16 must be rated for 110 volt to operate properly.

Figure 2:
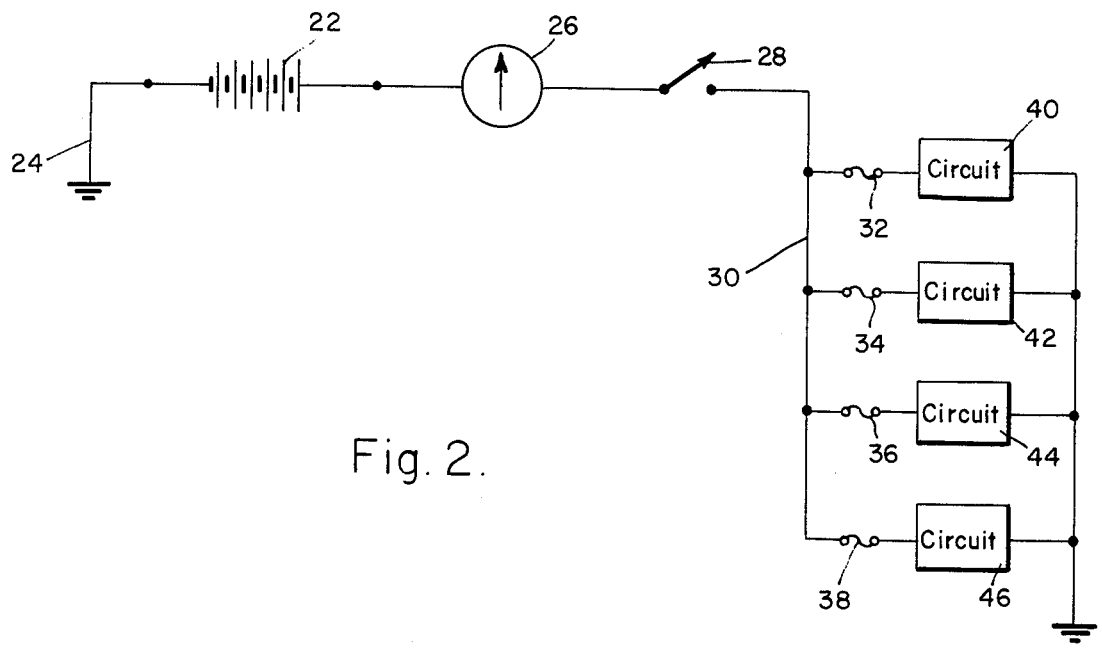
FIG. 2 is a schematic diagram of a conventional vehicle circuit using battery ignition.

Referring now to FIG. 2, there is shown a conventional simplified schematic diagram of a 12 volt automobile system.

A 12 volt battery 22 is connected in circuit with the negative side of the battery connected to ground 24. The positive side of the battery 22 is connected in circuit through an ammeter 26 to an ignition switch 28 shown in the normally open condition.

The load side of the ignition switch 28 is connected to a buss bar 30 connected to a plurality of fused circuits identified as fuses 32, 34, 36 and 38, each fuse in turn is connected in series with a circuit 40, 42, 44 and 46, respectively. The other side of circuits 40, 42, 44 and 46 are connected to a common ground thereby completing the circuit back to the negative terminal of the battery 22 through ground connection 24.

Figure 3:
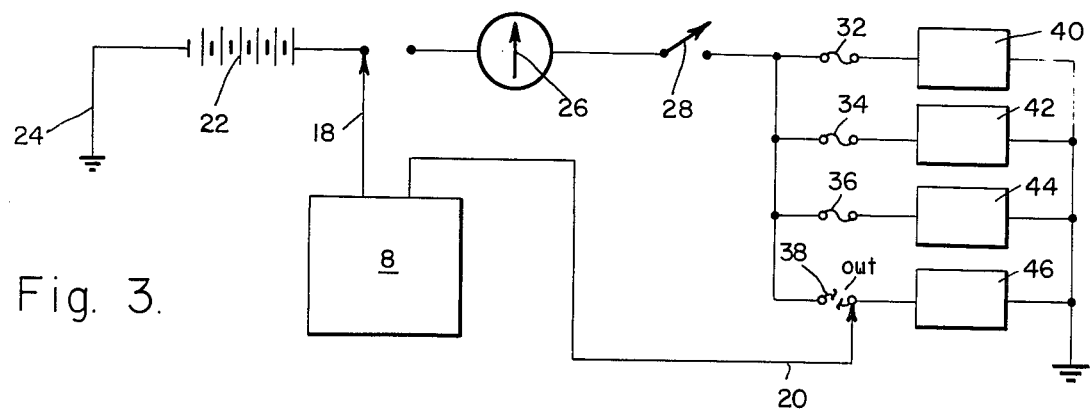
FIG. 3 is a schematic diagram illustrating how the fault locator illustrated in FIG. 1 is used in a vehicle circuit as illustrated in FIG. 2.

Referring now to FIG. 3, there is shown the same vehicle schematic diagram as illustrated in FIG. 2, however, in FIG. 3 it is assumed that fuse 38 has blown out as a result of a ground fault located in circuit 46.

In the preferred method of using the invention it is recommended that the positive terminal of battery 22 be disconnected and that terminal 18 associated with the short detector 8 be connected to the hot ungrounded posts of battery 22. Terminal 20 of short detector 8 is then connected to the load side of blown out fuse 38.

The embodiment as illustrated in FIG. 3 will cause the resettable circuit breaker associated with the short locator 8 to close as a result of the short circuit current flowing through the fault in load 46 through the ground 24 and back through the battery 22 and back through terminal 18 into the short detector 8. The short circuit current will cause the resettable circuit breaker to alternately open and close thereby causing the lamp and the buzzer associated with the short locator 8 to continually give an aural and visual sound indicating to the user that the short detector 8 has been properly connected to the damaged line.

In practicing the teachings of the present invention it is considered desirable to disconnect the hot terminal of the battery 22 from the circuit while leaving the grounded side of the battery connected to the vehicle. It is of no consequence whether the particular vehicle uses a grounded negative or a grounded positive terminal since the invention will operate regardless of which terminal is grounded. Terminal 18 of the short detector 8 is connected to the hot terminal of battery 22 and terminal 20 of the short detector is connected to the load side of the circuit that has blown the fuse, which in this case is fuse 38.

Persons skilled in the art will of course have previously identified that circuit 46 had a fault by the fact that fuse 38 had been rendered defective. However, in the event a person not skilled in the art is practicing the invention, it is only necessary for the operator using terminal 20 to sequentially place terminal 20 on the load side of fuse 32, 34, 36 and 38 to determine which load circuit is faulted. Placing terminal 20 on the load side of fuse 32, 34, or 36 will not produce a short circuit current since by definition loads 40, 42 and 44 are proper and do not contain a fault. Without a short circuit current there will be no evidence of a heavy spark when placing terminal 20 on the fuses and further there will be no evidence either by means of the alternating buzzer or the alternating light emanating from the short detector 8 to indicate the presence of a fault. As soon as the operator places terminal 20 on the load side of fuse 38 a heavy short circuit current will be present evidenced by a spark and the fact that the alternating buzzer and alternating light indicia located within the short detector will be made available to the user indicating he has selected the proper faulted circuit.

The operator simply leaves terminal 20 connected which should produce perceptual data to the user that the circuit having the fault has been located by means of the alternating buzzer and the alternating light. At this point in time the operator has identified circuit 46 as containing the fault and it is now necessary to refer to FIG. 4 in order to locate the specific point in load circuit 46 that contains the fault.

Figure 4:
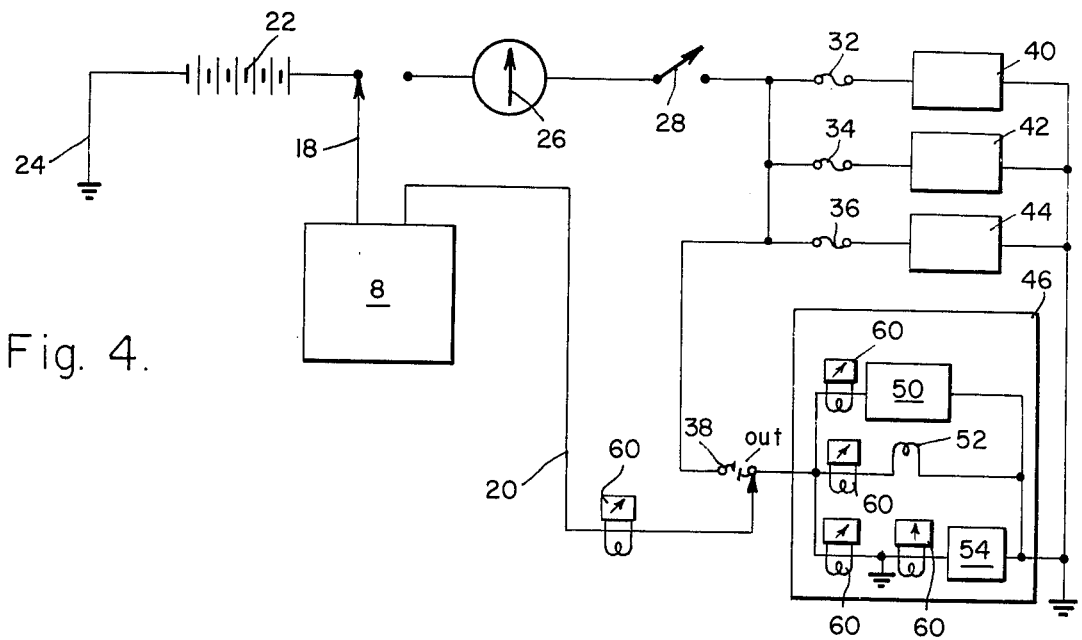
FIG. 4 is a schematic diagram further illustrating details and methods of utilizing the fault locator illustrated in FIG. 1 to specifically identify and locate the fault condition.

Referring now to FIG. 4, there is shown a schematic diagram similar to FIG. 3 but differing only in that load circuit 46 has been expanded to include a load circuit 50, a light bulb 52, and a load circuit 54, all connected in parallel and protected by fuse 38.

The fault located in circuit 46 has been arbitrarily selected as a ground 56 located in circuit before load 54.

As mentioned previously in discussing the operation of FIG. 3, the operator has placed the terminal 20 on the load side of fuse 38 which now causes a short circuit current to flow from the battery 22 through terminal 18 through the resettable circuit breaker associated with the load detector 8 through the terminal 20 and to load 46 and through the ground fault 56 to ground and back to battery 22 through ground 24.

An induction current measuring ammeter 60 is placed in close proximity to lead 20 and will indicate a varying current changing from zero to a maximum and back to zero as the resettable circuit breaker and short detector 8 opens and closes and allows a pulsating short circuit current to flow through the line. The operator simply moves the ammeter 60 along the lead 20 and to the load 46, continually noting the variation and the indications of the ammeter. Placing the ammeter on the line feeding load 50 will produce a zero indication indicating to the operator that no pulsating short circuit current is flowing to load 50.

Placing the ammeter 60 in circuit with the lamp 52 will also produce a zero indication indicating to the operator that no short circuit current is flowing through the bulb 52.

Placing the ammeter 60 in a line feeding load 54 will produce a varying current indicating to the operator that he has selected the proper line containing the pulsating short circuit current. The operator simply moves the ammeter along the line until he reaches a position beyond the actual short as indicated by ground 56, at which point the ammeter will cease to read varying current but will read only a zero current. This will immediately indicate to the operator that no short circuit current is flowing in that line.

The operator then moves the ammeter 60 until he notices an immediate cessation of varying current which is the indicia that indicates the exact location of the grounded fault in the circuit.

The operation of the induction ammeter 60 is such that the ammeter need only be placed in close proximity to the circuit carrying the pulsating short circuit current and it is not necessary for the operator to physically touch the wire or to otherwise separate or make the wire available to the touch or visual inspection of the operator. The magnetic field associated with the pulsating short circuit current can be detected by the ammeter 60 through sheet metal, insulation, wood, headliner, and similar type material generally used in the construction of vehicles being described.

If we assume for example that the short is located somewhere within the headliner of the vehicle and in a wire running from the engine compartment to the rear tail light assembly, it is only necessary for the operator to move the ammeter 60 along the headliner until the cessation of varying current is noted. At that point the operator has located the exact place where the short occurs and it is not necessary for the operator in looking for the short to remove the headliner or otherwise disturb the wires during the investigation process. Certainly when the operator has discovered the short, it is only necessary to open and make the offending wires available to his inspection and ultimate repair.

This feature of the invention is particularly important when the wires being investigated are not physically available to be inspected but are rather in a conduit or sheltered area, either beneath a runningboard, behind a panel or headliner as previously described.

Figure 5:
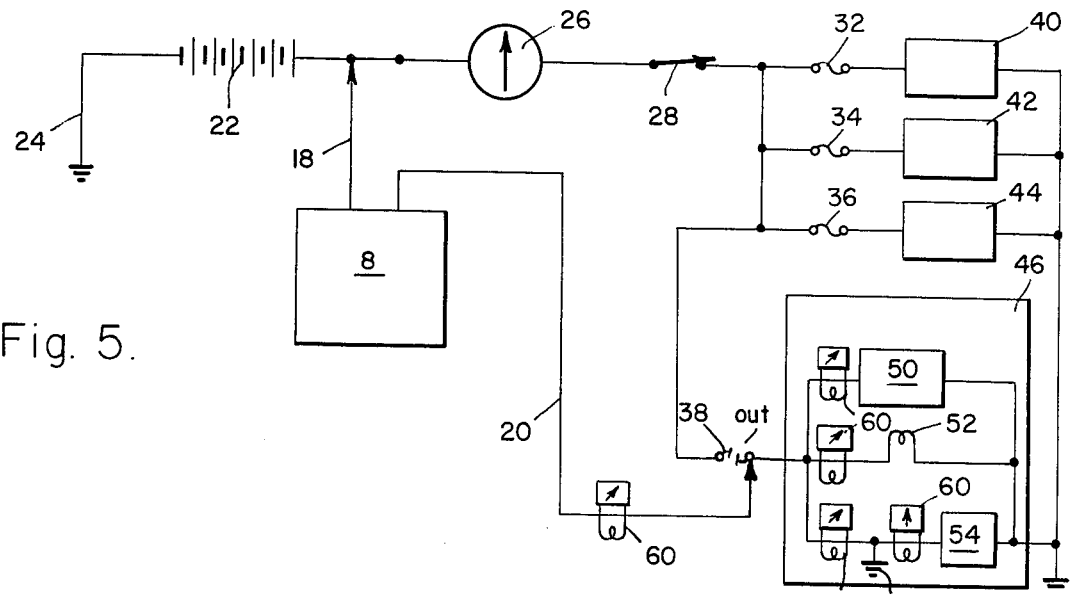
FIG. 5 illustrates how the fault detector illustrated in FIG. 1 may be used to locate a fault condition in a live circuit.

Referring now to FIG. 5, there is shown a similar automobile schematic diagram of the type shown in FIG. 2, however, in FIG. 5, switch 28 is closed and the normal loads 40, 42 and 44 are operating in their conventional manner.

If we assume the same grounded fault as shown in FIG. 4, it will be apparent that fuse 31 will have blown and that load 46 will have become inoperative due to the blown fuse 38. The invention may be practiced on a live circuit and in an operating environment as well as on a disconnected circuit as illustrated in connection with FIG. 4. Line 18 is connected to the hot side of battery 22 and line 20 is similarly connected to the load side of load 46 and the apparatus is used in the same fashion as described in connection with 44 since the pulsating resettable circuit breaker 8 will cause a short circuit current to pulsate through line 20 and through the grounded fault at 56. The same procedures will be used to locate and specifically identify the exact location of the fault as previously mentioned. The apparatus and method described may be used for a 12 volt DC, 6 volt DC or any other voltage system. The apparatus and method may also be used for 110 volt AC systems whether they be vehicles or fixed base electrical installations.

In practicing the invention the operator will soon observe that whenever the grounded fault is eliminated, the resettable circuit breaker will no longer carry the short circuit current and hence the circuit breaker will no longer open but stay closed thereby indicating to the operator that the grounded fault has been eliminated. This fact will be further indicated to the operator by the absence of the flashing light and absence of the audible sound from the buzzer associated with the fault locator 8. If perchance the grounded fault is only temporarily removed and hasn't been permanently fixed the circuit is protected by the resettable circuit breaker since the resettable circuit breaker will immediately open should the fault reappear on the line causing a short circuit current to flow through the short locator 8 thereby providing instant and immediate protection for the circuit being tested while the grounded fault is being located.

I claim:

1. A method for locating a grounded fault in a vehicle having a plurality of protected electrical circuits energized by a battery comprising the steps of, first disconnecting the battery hot terminal leaving only the grounded terminal of the battery connected, connecting an automatic resettable circuit breaker across the free hot terminal of the battery and the load side of each of the pluarlity of protected circuits under test individually one by one, selecting a protected circuit under test showing evidence of sparking when connecting the circuit breaker while maintaining the connection of the circuit breaker across the hot terminal and the load side of the protected circuit under test showing evidence of sparking, then moving an induction current measuring ammeter over the selected protected circuit under test showing evidence of sparking without disturbing said circuit and detecting a varying current, and then locating the grounded fault by noting the immediate absence of detected varying current.

* * * * *